United States Patent [19]

Parris et al.

[11] Patent Number: 5,680,362

[45] Date of Patent: Oct. 21, 1997

[54] CIRCUIT AND METHOD FOR ACCESSING MEMORY CELLS OF A MEMORY DEVICE

[75] Inventors: Michael C. Parris; Douglas B. Butler; Kim C. Hardee, all of Colorado Springs, Colo.

[73] Assignees: United Memories, Inc., Colorado Springs, Colo.; Nippon Steel Semiconductor Corporation, Chiba, Japan

[21] Appl. No.: 657,637

[22] Filed: May 30, 1996

Related U.S. Application Data

[63] Continuation of Ser. No. 456,059, May 31, 1995, Pat. No. 5,548,558.
[51] Int. Cl.⁶ .................................. G11C 8/00; G11C 7/00
[52] U.S. Cl. ............................. 365/230.01; 365/230.06; 365/230.08; 365/201
[58] Field of Search .............................. 365/201, 230.01, 365/230.06, 230.08

[56] References Cited

U.S. PATENT DOCUMENTS

| | | | |
|---|---|---|---|
| 4,914,632 | 4/1990 | Fujishima et al. | 365/201 |
| 5,131,018 | 7/1992 | McAdams et al. | 365/236 |
| 5,313,425 | 5/1994 | Lee et al. | 365/201 |
| 5,327,380 | 7/1994 | Kersh, III et al. | 365/203.06 |
| 5,394,373 | 2/1995 | Kawamoto | 365/230.06 |
| 5,406,526 | 4/1995 | Sugibayashi et al. | 365/230.06 |

FOREIGN PATENT DOCUMENTS

| | | |
|---|---|---|
| 0 574 002 A2 | 12/1993 | European Pat. Off. . |
| 0 600 160 A2 | 6/1994 | European Pat. Off. . |
| 0 609 577 A2 | 8/1994 | European Pat. Off. . |

*Primary Examiner*—David C. Nelms
*Assistant Examiner*—Trong Quang Phan
*Attorney, Agent, or Firm*—William J. Kubida; Holland & Hart LLP

[57] ABSTRACT

A circuit and method for concurrently addressing at least two rows of memory cells of a memory array of a memory device. By concurrently addressing at least two rows of memory cells during testing of the memory device during a burn-in period, the memory device can be tested in a reduced time period.

22 Claims, 13 Drawing Sheets

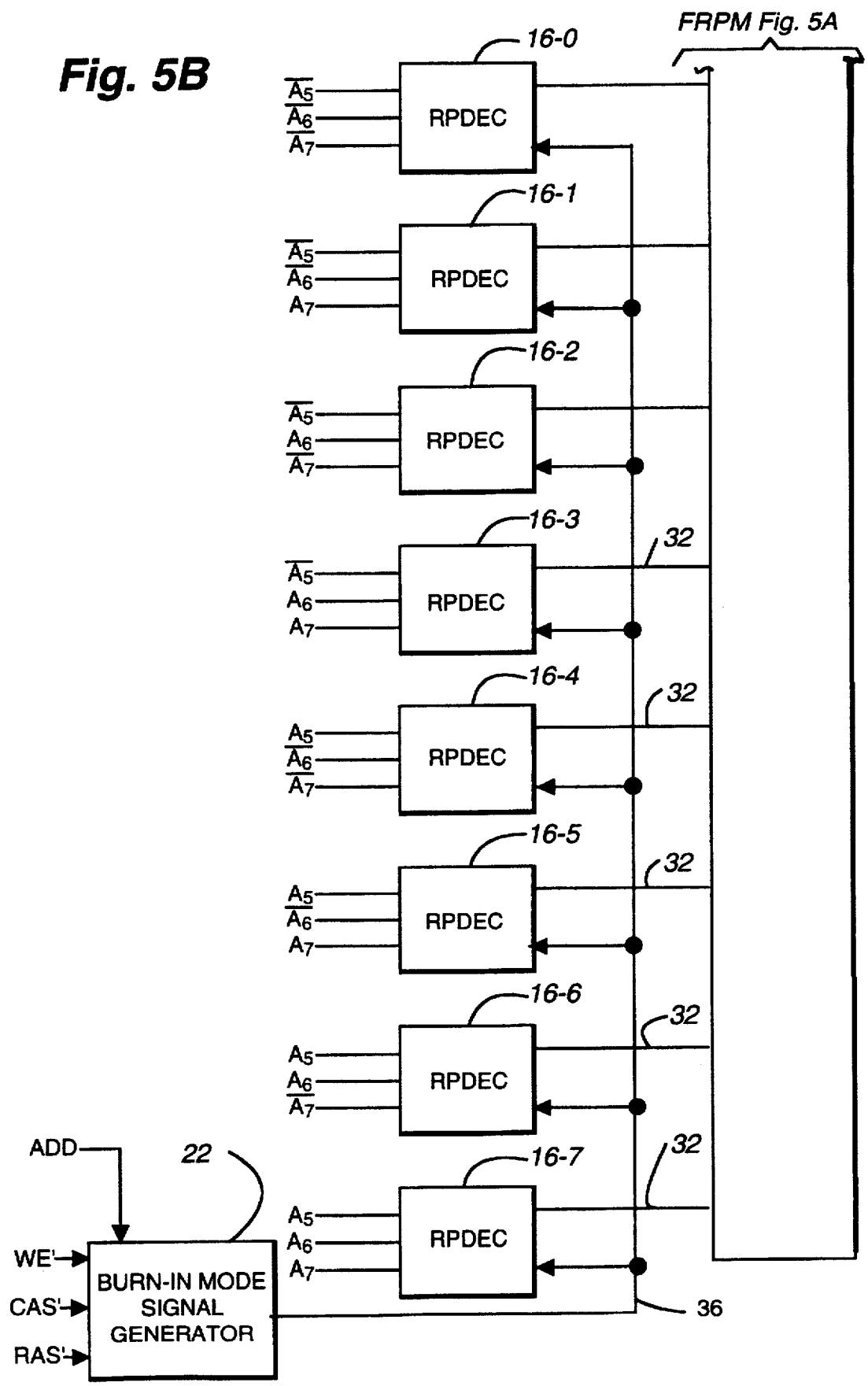

TO Fig. 6A

CIRCUIT AND METHOD FOR ACCESSING MEMORY CELLS OF A MEMORY DEVICE

This application is a continuation of Ser. No. 08/456,059 filed May 31, 1995, which is U.S. Pat. No. 5,548,558, now withdrawn.

BACKGROUND OF THE INVENTION

The present invention relates generally to memory devices having an array of memory cells addressable responsive to address select signals. More particularly, the present invention relates to a circuit, and an associated method, which permits at least two rows of memory cells of the memory array to be addressed concurrently.

Testing of the memory device during a burn-in period subsequent to manufacture of the memory device can be completed in a reduced time period by concurrently addressing and stressing memory cells located in at least two rows of memory cells.

Digital memory devices form portions of many types of digital circuits. The memory devices permit the storage of digital data which may be accessed during operation of the digital circuits. A computer is exemplary of a device having digital circuits which include memory devices. Most conventional computers include memory devices permitting the storage of significant amounts of data. The data is accessed during operation of the computers.

A random access memory device is a type of memory device which is frequently utilized in a digital circuit. A random access memory device includes memory cells for storing bits of digital data therein. Any one of the memory cells can be addressed and, hence, accessed independently of any other of the memory cells. In contrast, memory cells of serial access memories can be accessed only sequentially.

Random access memory devices include both read only memory (ROM) and also read/write memory (RAM). Both ROM and RAM include static-load, synchronous, and asynchronous types of devices. Static-load memories require no clock. Synchronous RAMs or ROMs require a clock edge to enable memory operation while asynchronous RAMs recognize address changes and output new data after any such change. The memory cells of RAMs can further be divided into static memory structures and dynamic memory structures. Static memory structures use some form of latched storage, while dynamic cells use dynamic storage of charge on a capacitor.

Dynamic RAMs (DRAMs) have achieved wide commercial usage in many varied types of digital devices. Dynamic RAMs have a relatively quick access rate and are particularly suitable when a digital circuit must be operable to retrieve data at high rates.

DRAMs, as well as other types of memory devices, are initially tested subsequent to their manufacture to ensure that the memory operates properly. The initial testing period is sometimes referred to as the "burn-in" period. During the burn-in period, the memory cells of the memory device are addressed and stressed. By addressing and stressing the memory cells of the device, a determination can be made as to whether the memory cells are defective. Typically, each memory cell is stressed several times to ensure that the memory cell is not defective.

With continued technical advancements, memory devices of increasingly large storage capacities have been developed. When such memory devices having increased storage capacities are tested subsequent to their manufacture during the burn-in period, however, the increased storage capacity makes addressing and stressing of the memory cells of the memory devices during their testing more time consuming as additional time is required to address and stress the additional memory cells.

As the memory devices include increasingly greater numbers of memory cells, there is a corresponding increase in the likelihood that the memory devices might include a defective memory cell. Also, as the physical dimensions of the memory cells decrease, the possibility that even a minor physical defect of a memory cell renders the cell defective increases.

By increasing the burn-in period, each of the memory cells can be addressed and stressed to detect the existence of defects. However, by increasing the burn-in period, the throughput of the memory devices in a testing process is reduced.

Increasing the temperatures of the memory devices while the memory cells are stressed is sometimes attempted to reduce the time period required to properly stress the memory cells. Increasing the voltage levels of signals applied to the memory cells is sometimes also attempted, similarly to reduce the time period required to properly stress the memory cells. However, the increased temperature or voltage might precipitate other failures of the memory device, and not failures indicative of a defect of the memory cells. That is to say, by increasing the voltage or temperature, a failure might be induced which is indicative of the increased voltage or temperature rather than a memory cell defect.

Means by which the memory cells of a memory device can be stressed at increased rates without increasing the temperatures of the memory devices or increasing the voltage levels of signals applied to the memory devices would therefore be advantageous.

It is with respect to these considerations and other background information relative to memory devices that the significant improvements of the present invention have evolved.

SUMMARY OF THE INVENTION

The present invention advantageously provides a circuit, and an associated method, which permits the rate at which memory cells of a memory device are stressed during testing thereof to be increased without increasing the voltage levels of signals applied to the memory device or increasing the temperature levels of the memory device.

The circuit and method of the present invention permits at least a doubling of the rate at which a memory device may be tested. Because of such increased rate, the throughput of memory devices in a testing process is increased.

In accordance with the present invention, therefore, a circuit, and an associated method, for a memory device is disclosed. The memory device has rows and columns of memory cells together forming a memory cell array and addressing circuitry operative responsive to address select signals for addressing selected rows of the memory cell array. Signals representative of the address select signals and a test mode signal are received. Row select signals formatting addressing of selected rows of the memory cell array are generated. Decoding circuitry is coupled to receive the signals representative of the address select signals. The decoding circuitry generates the row select signals permitting the addressing of the selected rows responsive to value representative of the address select signals. Test mode circuitry is coupled to receive the test mode signal and is coupled to the decoding circuitry. The test mode circuitry is operative responsive to reception of the test mode signal for causing the decoding circuitry to generate the row select signals for permitting addressing of at least one additional row of the memory cell array. The circuit is coupled to receive address select signals and a test mode select signal. The circuit is operative to generate a row select signal. The coding circuitry is coupled to receive the address select signals. The decoding circuitry generates the row select signal when the address select signals are of a first selected value. Test mode circuitry is coupled to receive the test mode signal and to the decoding circuitry. The test mode circuitry is operative responsive to reception of the test mode signal to cause the decoding circuitry additionally to generate the row select signal when the address select signals are of at least a second selected value.

A more complete appreciation of the present invention and the scope thereof can be obtained from the accompanying drawings which are briefly summarized below, the following detailed description of the presently preferred embodiments of the invention, and the appended claims.

BRIEF DESCRIPTION OF THE DRAWINGS

FIG. 5A–5B illustrates a block diagram of a circuit of an embodiment of the present invention, here coupled to receive address select signals on three address lines.

DETAILED DESCRIPTION

Figure 1:
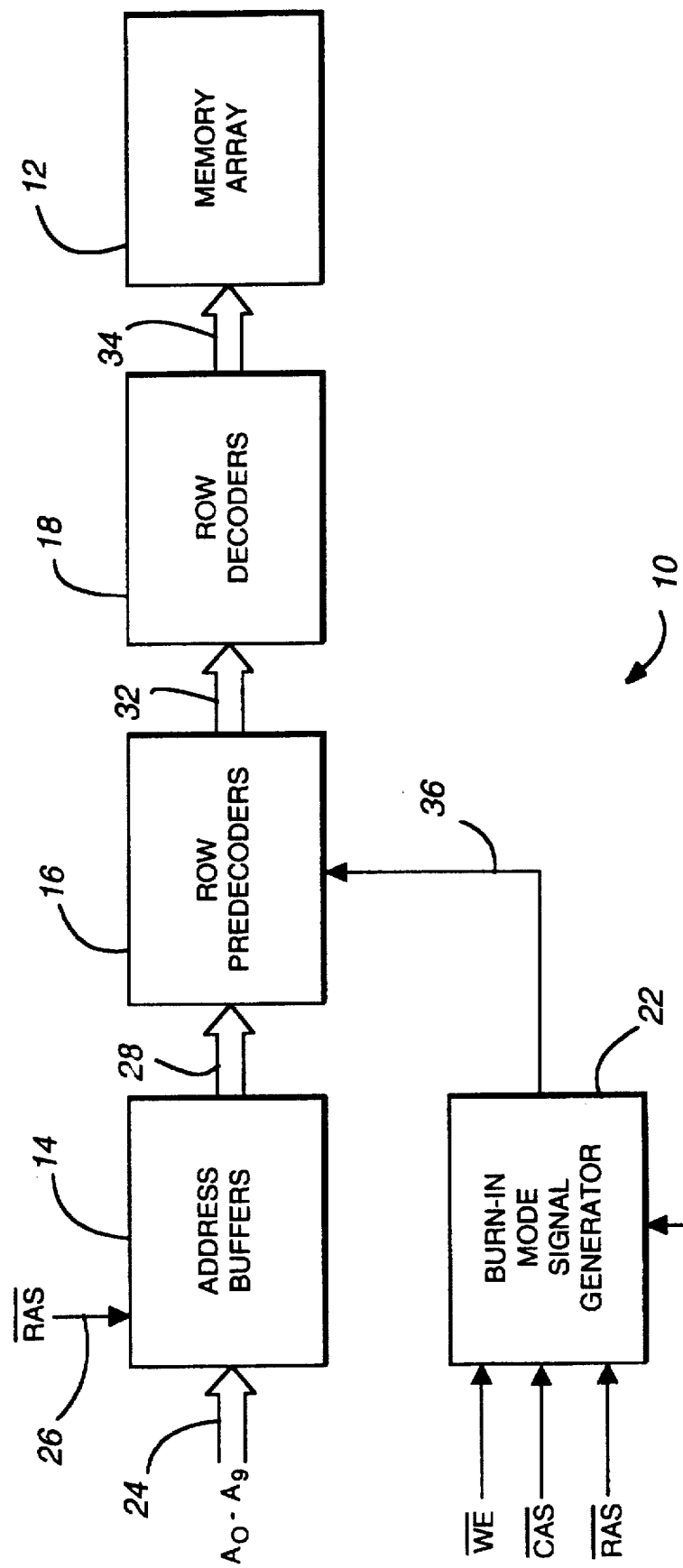
FIG. 1 illustrates a functional block diagram of a memory device which includes a circuit of an embodiment of the present invention.

FIG. 1 illustrates a memory device, shown generally at 10, of an embodiment of the present invention. The memory device 10 is formed of a dynamic random access memory (DRAM) and includes a memory array 12 formed of a plurality of memory cells arranged in rows and columns, in conventional manner, together to form the array 12 of memory cells.

While the memory device 10 illustrated in the figure forms a DRAM, other types of memory devices can similarly be illustrated, and the teachings of the present invention can be embodied in such other types of memory devices.

The memory device 10 further includes addressing circuitry including address buffers 14, row predecoders 16, row decoders 18, and a burn-in mode signal generator 22.

The address buffers 14 are coupled to receive address select signals on address select lines 24. The address select signals are binary signals, designated by $A_0$ through $A_9$, for application to the address buffers 14. Signals $A_0$–$A_9$ are utilized when the memory device 10 is of a 4 megabit memory size. In other embodiments in which the memory device is of other memory sizes, other numbers of address select signals are utilized. Values of the address select signals determine which rows and columns of memory cells of the memory are addressed.

The address buffers 14 are operative to place the values of the address select signals applied thereto on the lines 24 into forms which may be utilized by the elements of the memory device 10 and to latch the values of the address select signals. The address buffers 14 are further coupled to receive an inverse of a row address select ($\overline{RAS}$) signal on line 26. When the $\overline{RAS}$ signal is generated on the line 26, the address buffers 14 latch the values of the address select signals generated on the lines 24.

The address buffers 14 generate buffered signals on lines 28 which are applied to the row predecoders 16. The row predecoders 16 include separate predecoders corresponding in number to the number of possible values of the address select signals generated on the lines 24. When a particular value of address select signal is generated on the lines 24, a predecoder of the row predecoders 16 generates a signal on a line of the lines 32 which are coupled to the row decoders 18. The row decoders 18 generate signals on the word lines 34 to address selected rows of memory cells of the memory array 12.

The burn-in mode signal generator 22 generates a burn-in mode, or test mode, signal on the line 36 which is applied to the predecoder elements of the row predecoders 16. The burn-in mode signal generator 22 generates the burn-in mode signal responsive to times in which input signals are applied to the signal generator in a specified sequence. Namely, the burn-in mode signal generator 22 is coupled to receive the aforementioned $\overline{RAS}$ signal as well as an inverse of a column address select $\overline{CAS}$ signal and an inverse of a write enable $\overline{WE}$ signal. The burn-in mode signal generator 22 is further coupled to receive selected ones of the address select signals, here address select signals $A_5$, $A_6$, and $A_7$. The $\overline{RAS}$, $\overline{CAS}$, and $\overline{WE}$ signals are all defined by the Joint Electronic Device Engineering Council (JEDEC) standards and are conventional in nature.

FIGS. 2A–E illustrate the relationship between the $\overline{RAS}$, $\overline{CAS}$, and $\overline{WE}$ signals applied to a DRAM. Application of the $\overline{RAS}$, $\overline{CAS}$, and $\overline{WE}$ signals to the signal generator 22 in a specified sequence causes the signal generator to generate the burn-in mode signal. When the burn-in mode signal is generated and applied to the predecoders 16, at least one additional predecoder element of the row predecoders 16 is caused to generate a row select signal on the lines 32. In turn, at least an additional one of the row decoders 18 is caused to generate a signal on the word lines 34. The generation of the additional signal on at least an additional one of the word lines 34 causes an additional row of the memory cells of the memory array 12 to be addressed. When a row of memory cells is addressed, the addressed memory cells can then be powered, or "stressed." Therefore, when the burn-in mode signal is generated to cause the at least additional row of memory cells to be addressed, the number of memory cells stressed during a particular time may be increased.

By appropriate generation of address select signals on the lines 24 together with generation of the burn-in mode signal, all of the rows of memory cells of the memory array 12 can be addressed and stressed during a burn-in period to ensure that the memory cells of the array 12 operate properly. Because at least one additional row of memory cells is addressed when the burn-in mode signal is generated, all of the memory cells of the memory arrays can be addressed and stressed in a reduced period of time.

The timing relationships between the $\overline{RAS}$, $\overline{CAS}$, and $\overline{WE}$ signals applied to the DRAM forming the memory device 10 cause operation of the memory device in various operational modes. The timing relationships are defined by the aforementioned JEDEC standards.

Figure 2A:
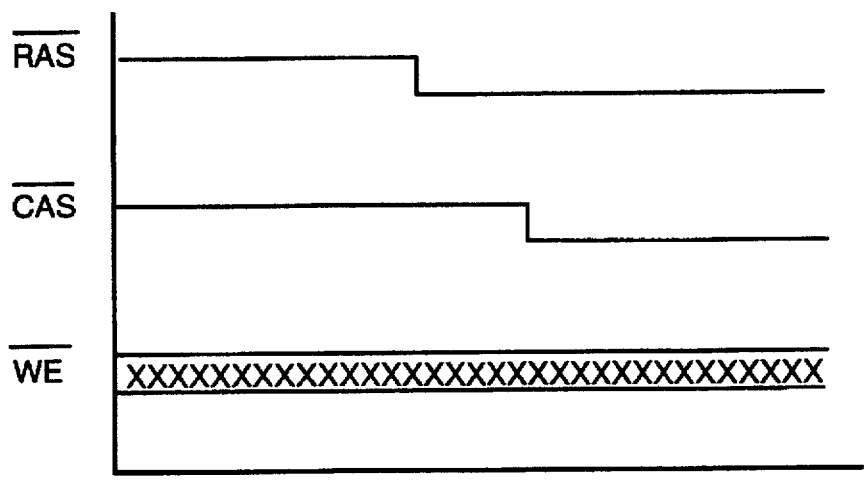
FIGS. 2A–2E illustrate timing diagrams illustrating the timing relationship between signals causing operation of the circuit shown in FIG. 1.

In FIG. 2A, the wave forms indicate a generation of the $\overline{RAS}$, $\overline{CAS}$ and $\overline{WE}$ signals during normal operation of the memory device 10. The $\overline{RAS}$ signal is generated prior to the $\overline{CAS}$ signal and the value of the $\overline{WE}$ signal is a logical "don't care." During normal operation of the memory device, the rows of memory cells of the memory array 12 are addressed solely responsive to the values of the address select signals generated on the lines 24.

Figure 2B:
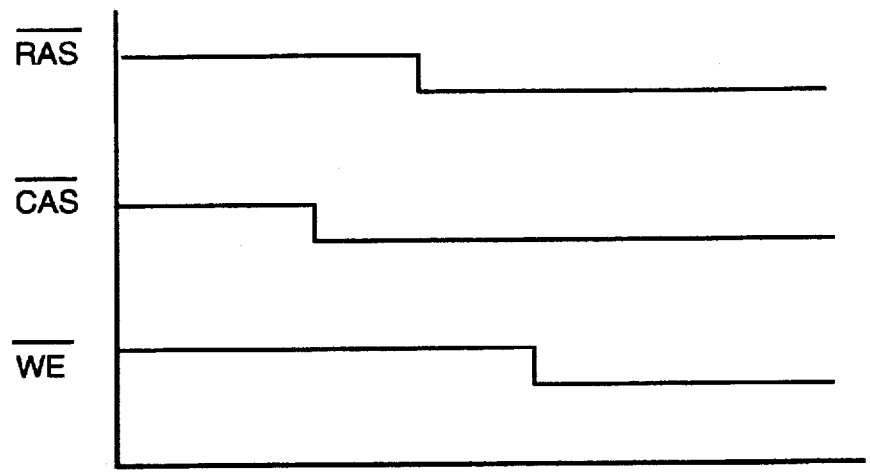

The trio of wave forms shown in FIG. 2B illustrates the generation of the $\overline{CAS}$ signal prior to generation of the $\overline{RAS}$ signal. Generation of the $\overline{CAS}$ signal prior to generation of the $\overline{RAS}$ signal is referred to CBR (for $\overline{CAS}$ before $\overline{RAS}$). When the $\overline{CAS}$ signal is generated prior to generation of the $\overline{RAS}$ signal, the memory cells of the memory array 12 are caused to be refreshed, in conventional manner.

Figure 2C:
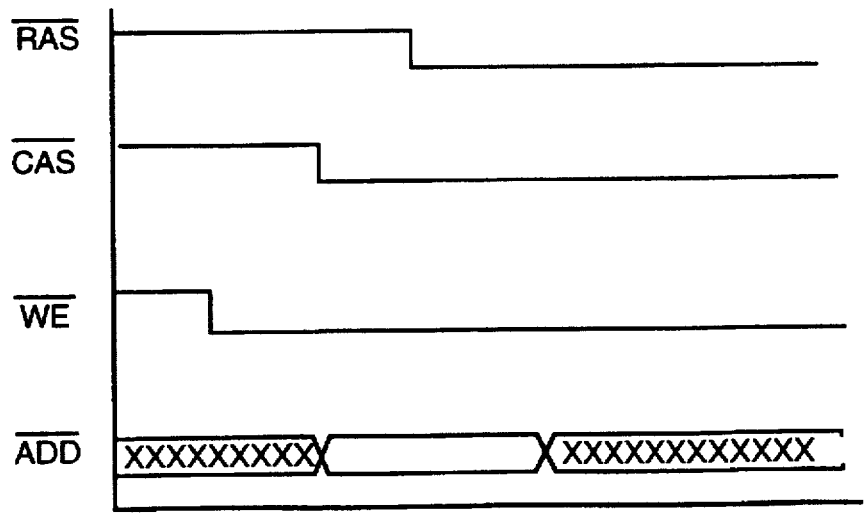

The group of wave forms illustrated in FIG. 2C is the sequence of generation of the $\overline{WE}$, the $\overline{CAS}$, and the $\overline{RAS}$ signals which, when applied to the device 10, generate special test modes. In particular, when the $\overline{WE}$, $\overline{CAS}$, and $\overline{RAS}$ signals and also selected address select signals are applied to the burn-in mode signal generator in the illustrated sequence, the signal generator generates the burn-in mode signal. As illustrated in FIG. 2C, the $\overline{WE}$ signal is generated prior to generation of the $\overline{CAS}$ signal, and the $\overline{CAS}$ signal is generated prior to generation of the $\overline{RAS}$ signal. The aforementioned JEDEC standards permits user-defined modes to be operable when the $\overline{WE}$, $\overline{CAS}$, and $\overline{RAS}$ signals are generated in the illustrated sequence. The user-defined mode is defined by values of selected address select signals applied to the device 10, indicated by the ADD signals in the figure. When the $\overline{WE}$, $\overline{CAS}$, and $\overline{RAS}$ signals are generated in the illustrated sequence, a user-defined mode, defined by the values of the ADD signals, is entered.

Figure 2D:
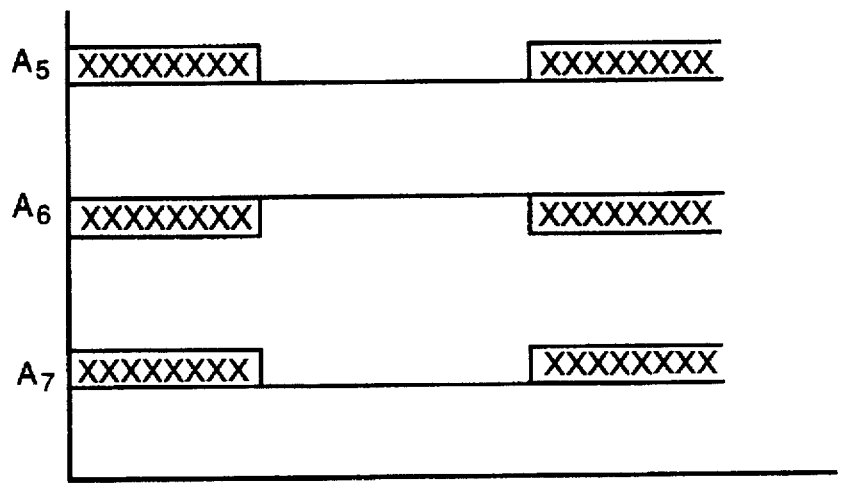

FIG. 2D illustrates the combination of values of the signals generated on the lines $A_5$, $A_6$, and $A_7$ which, when applied to the device 10 together with the signals applied to the device 10 in the manner illustrated in FIG. 2C, cause the burn-in mode signal to be generated by the burn-in mode signal generator 22. Additional details of the generator 22 shall be described with respect to FIG. 7 below. When the signals are generated in the illustrated sequence and of the illustrated values, the signal generator 22 of the memory device 10 causes generation of the burn-in mode signal which is applied to the row predecoders 16. Therefore, when the signals are generated in the illustrated sequence and of the illustrated values, at least one additional row of memory cells is caused to be addressed and stressed. During testing of the memory device 10 during a burn-in, or other, period, application of the $\overline{WE}$, $\overline{CAS}$, and $\overline{RAS}$ signals together with the address select signals causes the memory cells of the memory array 12 to be stressed to determine the presence of defects.

As noted previously, while the memory device 10 illustrated in FIG. 1 is formed of a DRAM, other types of memory devices can similarly be illustrated. For instance, an SDRAM includes the same elements as those shown to form the memory device 10 with the exception of the signals applied to the burn-in mode signal generator 22 and the $\overline{RAS}$ signal applied to the address buffers 14. $\overline{WE}$, $\overline{CAS}$, and $\overline{RAS}$ signals are not utilized by an SDRAM. Instead, the address select signals $A_0$–$A_9$ (in a 4 megabit SDRAM) are applied to the burn-in mode signal generator 22. JEDEC-defined standards permit a user-defined function to be generated when the address select signal $A_7$ is of a logical "1" value. In one embodiment of the present invention, therefore, when the memory device 10 is formed of an SDRAM, generation of address select signal $A_7$ of a logical "1" value causes the device to enter a test mode. The values of others of the address select signals causes the burn-in mode signal generator 22 to generate a burn-in mode signal.

Once the burn-in mode has been entered and burn-in mode procedures have been completed, or it is otherwise desired to exit the burn-in mode, signals applied to the memory device 10 cause the device to exit the burn-in mode.

Figure 2E:
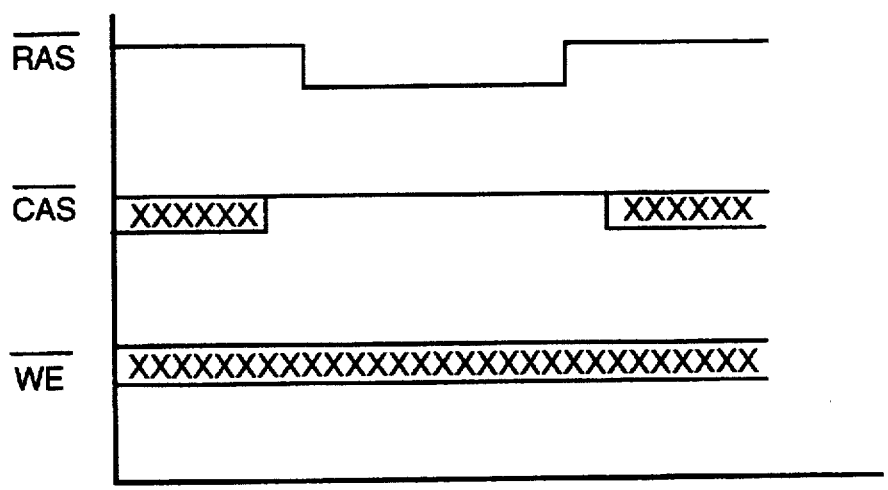

When the memory device 10 is formed of a DRAM, two manners of exiting the burn-in mode are defined. FIG. 2E illustrates a timing sequence of application of signals to the burn-in mode signal generator 22 to cause termination of generation of the burn-in mode signal. Here, the $\overline{CAS}$ signal is generated to be of a logical "1" the $\overline{RAS}$ signal is generated to be of a logical "0" value, and the $\overline{WE}$ signal is a logical "don't care."

An alternate manner by which the memory device 10 can be caused to exit the burn-in mode is illustrated back in FIG. 2B. Here, the $\overline{CAS}$ signal goes low, then the $\overline{RAS}$ signal goes low and the $\overline{WE}$ signal goes high. When the memory device 10 is formed of an SDRAM, generation of address select signals in which the $A_7$ signal is of a logical "0" causes exiting of the memory device out of the burn-in mode.

Once the burn-in mode has been exited, the memory device 10 is operable in conventional manner.

Figure 3:
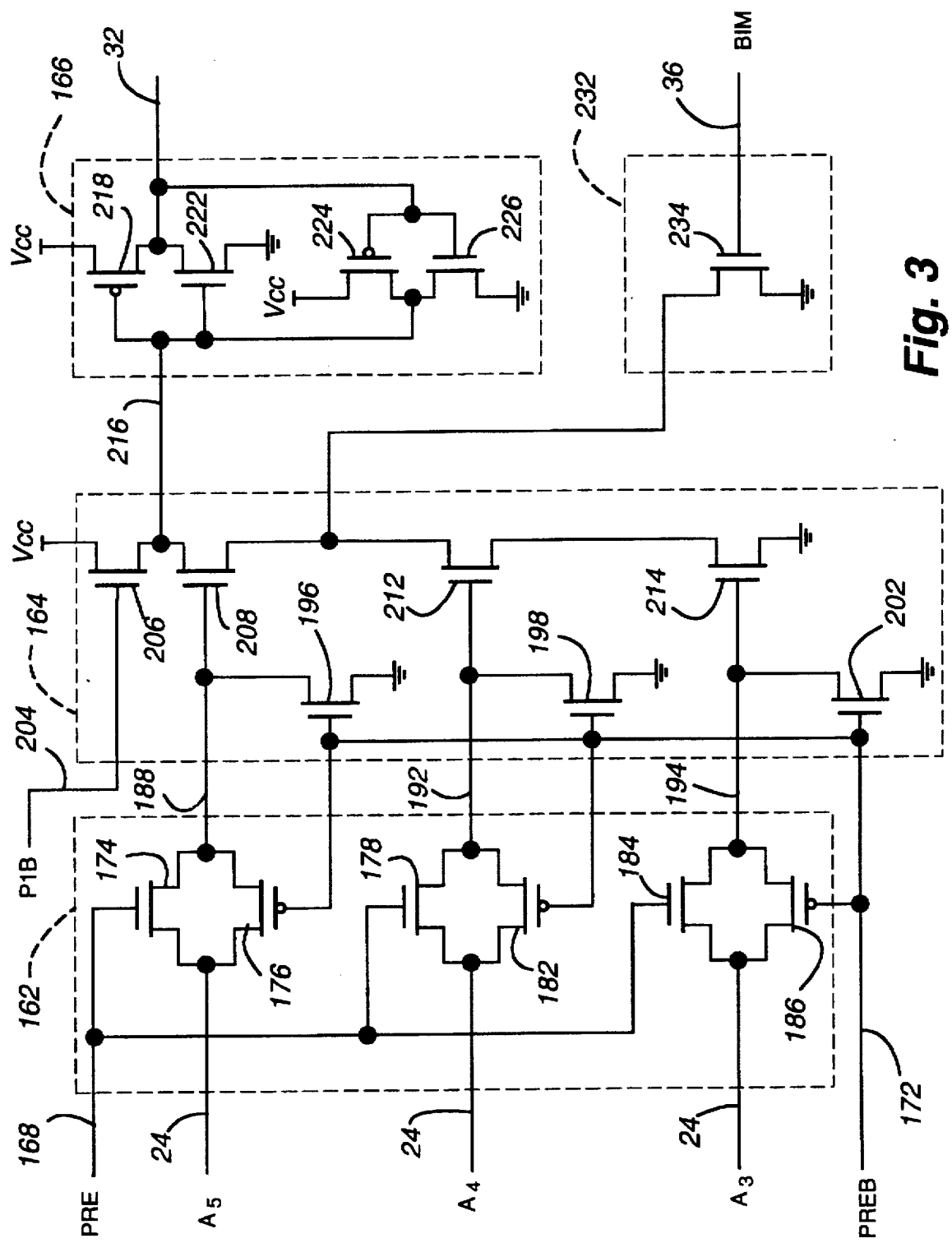
FIG. 3 illustrates a circuit diagram of a single row predecoder of the row predecoders shown in FIG. 1.

FIG. 3 illustrates a single predecoder element, here shown at 16-0, of the row predecoders 16 of the memory device 10 shown in FIG. 1. The predecoders 16 are formed of a plurality of predecoder elements similar to the predecoder element 16-0 illustrated in the figure. Portions of the predecoder element 16-0 correspond to portions of a conventional predecoder element for a memory device. Namely, the predecoder element 16-0 includes pass gate circuitry 162, latch setting circuitry 164 and latch circuitry 166. The components of the circuitry 162, 164, and 166 are, for purposes of example, shown to be formed of complementary metal oxides semiconductor (CMOS) elements. The predecoder element 16-0 can, of course, be formed of other types of circuit elements.

The pass gate circuitry 162 is coupled to receive address select signals on lines 24 and to receive a predecoder enable signal, and its inverse, on the lines 168 and 172, respectively. In the embodiment of the predecoder element 16-0 illustrated in the figure, three address select lines 24 are coupled to the pass gate circuitry 162. In other embodiments, greater or fewer numbers of address select lines can be coupled to the predecoder element with a corresponding alteration in the circuitry of the predecoder elements. The pass gate circuitry 162 includes a series of transistor pairs formed of transistors 174, 176, 178, 182, 184, and 186. Gate electrodes of the transistors are coupled to receive either the predecoder enable signal generated on line 168 or its inverse generated on line 172.

The values of the address select signals generated on the lines 24 are passed by the pass gate circuitry 162 on the lines 188, 192, and 194, in conventional manner, responsive to times in which the predecoder enable signal is generated on the line 168. When the predecoder enable signal is not generated, and the inverse of the predecoder enable signal is, conversely, generated, the transistors 196, 198, and 202 shunt the lines 188, 192, and 194, respectively, to ground. Otherwise, the signals generated on the lines 188, 192, and 194 are applied to the latch setting circuitry 164. The latch setting circuitry further is coupled to receive a precharge clock signal generated on the line 204.

The latch setting circuitry includes transistors 206, 208, 212, and 214, cascaded together. A gate electrode of the transistor 206 is coupled to line 204 upon which the precharge clock signal is generated. The gate electrodes of the transistors 208, 212, and 214 are coupled to the lines 188, 192, and 194, respectively.

Responsive to generation of a precharge clock signal on the line 204 and the values of the address select signals generated on the lines 26 and, in turn, on the lines 188–194, a signal is generated on the line 216 extending between the latch setting circuitry 164 and the latch circuitry 166.

The latch circuitry 166 is shown to be formed of transistors 218, 222, 224, and 226.

The line 216 is coupled to each of the transistors 218–226, in conventional manner, and the latch circuitry 166 is operative to latch the value of the signal supplied thereto on the line 216 and to generate a signal on one of the lines 32, also shown previously in FIG. 1.

The predecoder element 16-0 further includes burn-in mode signal circuitry 232 coupled to the line 36 to receive a burn-in mode signal generated by the burn-in mode signal generator 22 shown in FIG. 1. The burn-in mode signal circuitry 232 includes a transistor 234 having a gate electrode coupled to receive the burn-in mode signal generated upon the line 36. A source electrode of the transistor 232 is coupled to ground and a drain electrode of the transistor 234 is coupled to an electrode of the transistor 212. When the burn-in mode signal is generated, the transistor 234 turns on and shunts the transistors 212 and 214.

When the burn-in mode signal is generated, therefore, the values of the address select signals generated on the bottom two address select lines 24 do not determine whether a signal is generated upon the line 216. Generation of the burn-in mode signal thereby converts the values of the address select signals generated upon the bottom to address select lines 24 into logical "don't cares." Generation of a signal on the line 32 is thereby dependent solely upon the value of the address select signal generated upon the top-most address select line 24. When the transistor 234 is connected in the shunt connection across both transistors 212 and 214, a signal is generated on the line 32 for four times as many combinations of address select signals as contrasted to the number of combinations of address select signals which cause a similar generation of the signal on line 32 in the absence of the burn-in mode signal circuitry 232.

Figure 4:
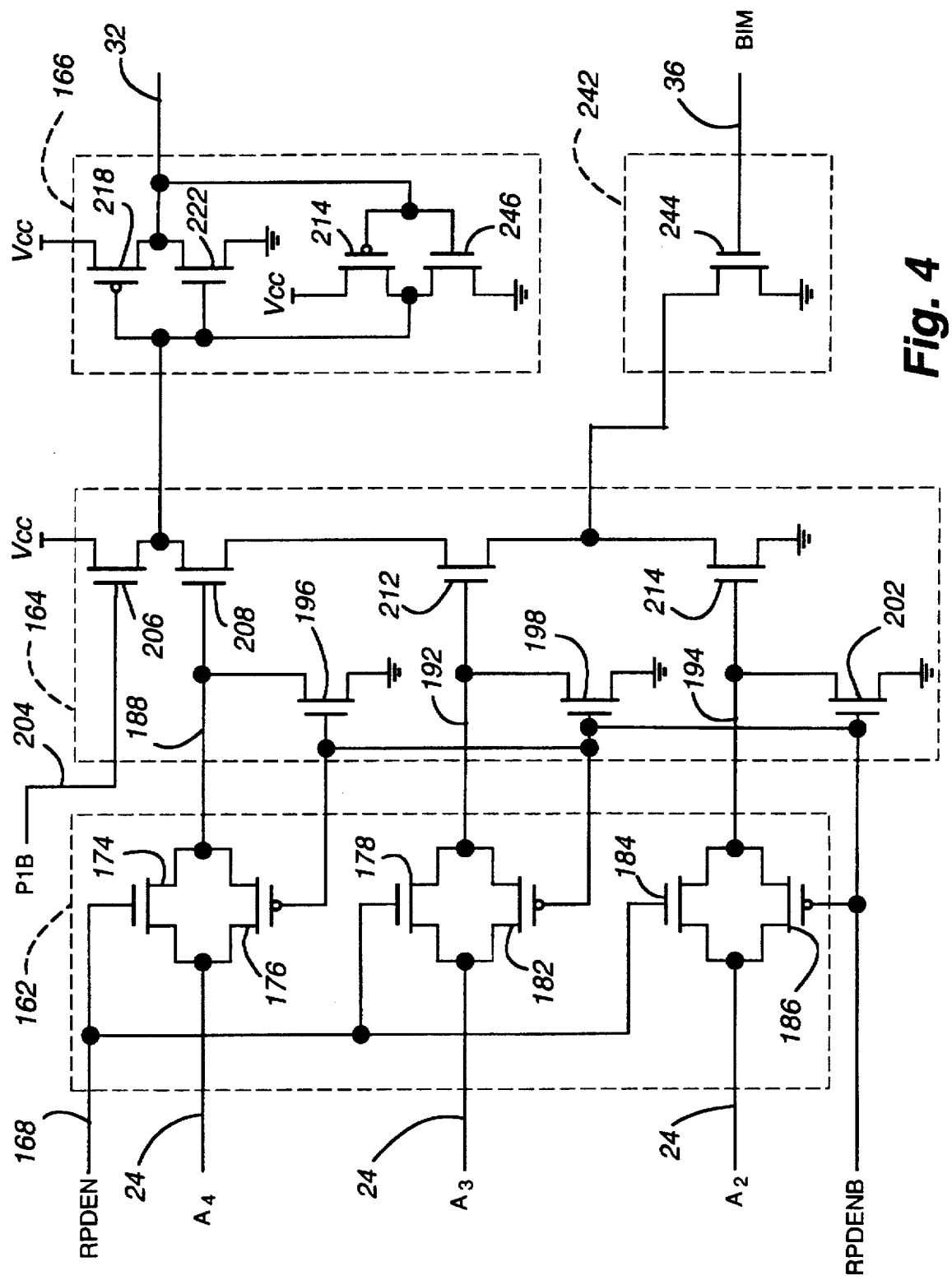
FIG. 4 illustrates a circuit diagram, similar to that shown in FIG. 3 but of a row predecoder of another embodiment of the present invention.

FIG. 4 illustrates a predecoder element, here shown at 26-0, which forms a single one of the predecoder elements of the row predecoders 16 shown in FIG. 1. The predecoder element 26-0 is similar to the predecoder element 16-0 illustrated in FIG. 3 and includes commonly-numbered pass gate circuitry 162, latch setting circuitry 164, and latch circuitry 166. The circuitry 162, 164, and 166 is, similar to the corresponding circuitry of the decoder element 16-0 shown in FIG. 3, formed of CMOS transistors.

The circuitry 162, 164, and 166 of the decoder element 26-0 includes transistors corresponding to the transistors of the circuitry 162, 164, and 166 of the decoder element 16-0.

The corresponding transistors of the decoder element 26-0 are designated by the same reference numerals used to designate the transistors of the decoder element 16-0. Operation of the corresponding transistors of the circuitry 162, 164, and 166 of the decoder element 26-0 are operable in manners similar to operation of the corresponding structure of the decoder element 16-0.

The decoder element 26-0 further includes burn-in mode signal circuitry 242 coupled to the line 36 to receive the burn-in mode signal generated thereupon. The burn-in mode signal circuitry 242 includes a transistor 244 having a gate electrode coupled to the line 36. When the burn-in mode signal is generated on the line 36 and applied to the gate electrode of the transistor 244, the transistor 244 turns on and shunts the transistor 214 of the latch setting circuitry 164.

Analogous to operation of the transistor 234 of the decoder element 16-0, the transistor 244, when turned on, increases the number of times in which a signal is generated upon the line 32. Here, because the transistor 244 is coupled across only transistor 214, and not both transistors 212 and 214, a twofold increase in the number of times in which the signal is generated on the line 32 occurs. The burn-in mode signal circuitry 242 causes the address select signal applied upon the line 24 to the pass gate circuitry 162 to form a logical "don't care."

While not shown, in another embodiment, burn-in mode signal circuitry, analogous to the burn-in mode signal circuitry 232 and 242, includes a transistor which is coupled across three transistors. When coupled across three transistors, the transistor of the burn-in mode signal circuitry permits an eight-fold increase in the number of times in which a burn-in mode signal is generated.

Figure 5A:
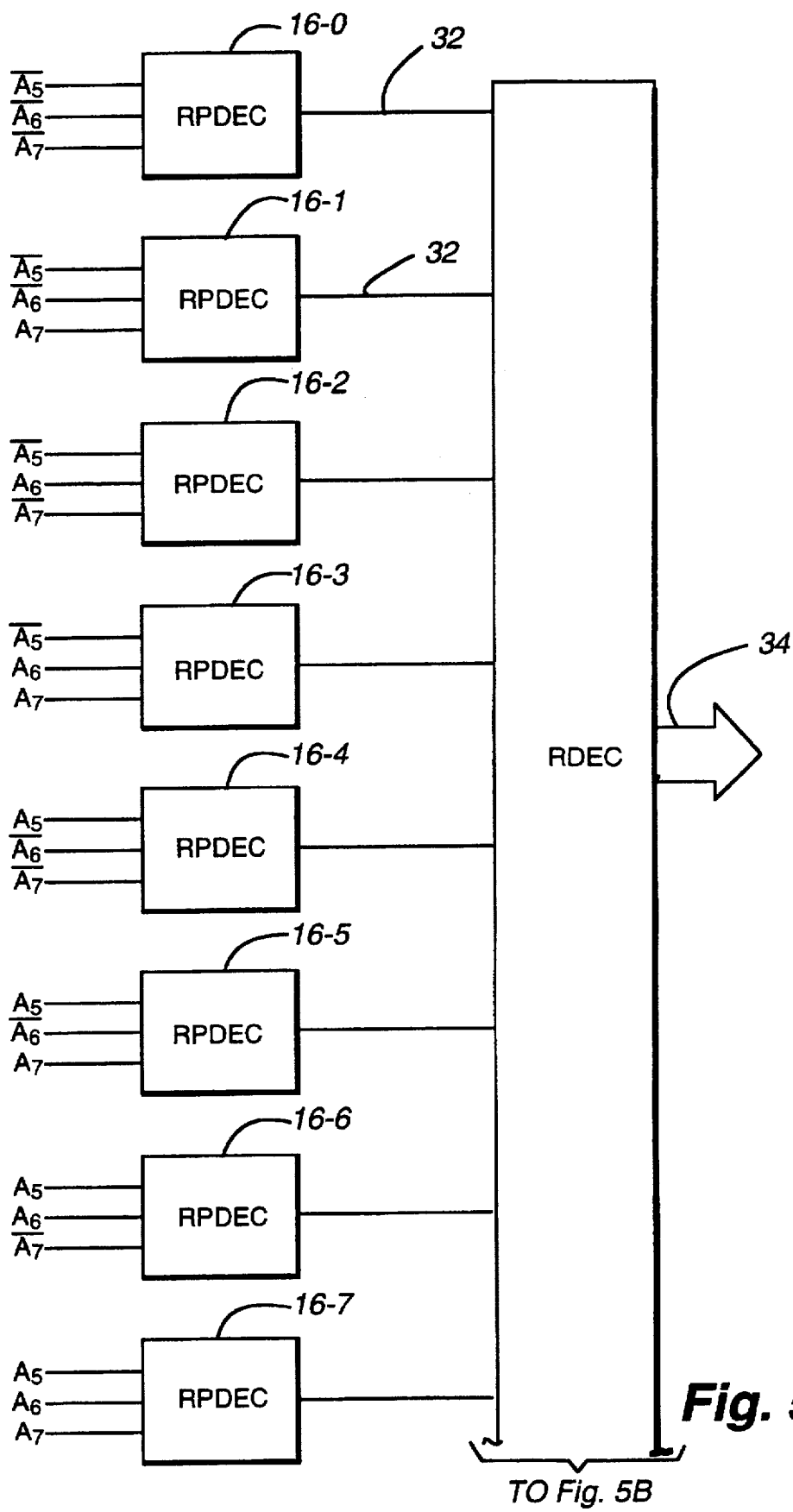

FIG. 5A–5B illustrates a portion of the addressing circuitry of the memory device 10 shown in FIG. 1. FIG. 5A–5B illustrates the plurality of row predecoders, here two banks, a top bank and a bottom bank of row predecoders 16-0, 16-1, 16-2, 16-3, 16-4, 16-5, 166, and 16-7 which together form the row predecoders illustrated as a single block in FIG. 1. Buffered and latched address select signals buffered and latched by the address buffers 14 in FIG. 1 are applied to each of the row predecoders 16-0 through 16-7. Line 36 is also coupled to each of the row predecoder elements of the bottom bank of row predecoder elements to supply the burn-in mode signal generated by the burn-in mode signal generator 22 to each of the predecoder elements. Line 36 is not coupled to the row predecoders of the top bank of row predecoders in the embodiment illustrated in the figure. Each of the row predecoder elements 16-0 through 16-7 is coupled to a line 32 which extends to a row decoder 18.

During normal operation of the memory device 10, the addressing circuitry receives address select signals on the address select lines 24. The value of the address select signals causes a single one of the row predecoder elements 16-0 through 16-7 of one of the sets of row predecoders to generate a signal on a corresponding one of the lines 32. When, however, the burn-in mode signal is generated on the line 36, the address select signal applied to the row predecoders 16-0 through 16-7 cause more than one of the row predecoders to generate a signal on a corresponding line 32. As described previously with respect to the row predecoder element 16-0 shown in FIG. 3, a four-fold increase in the number of row predecoders 16-0 through 16-7 generate signals on the lines 32 for any particular value of the address select signals. During testing of the memory device during a burn-in period, therefore, generation of the burn-in mode signal permits a greater number of rows of memory cells to be addressed and stressed during a particular time period.

Figure 6A:
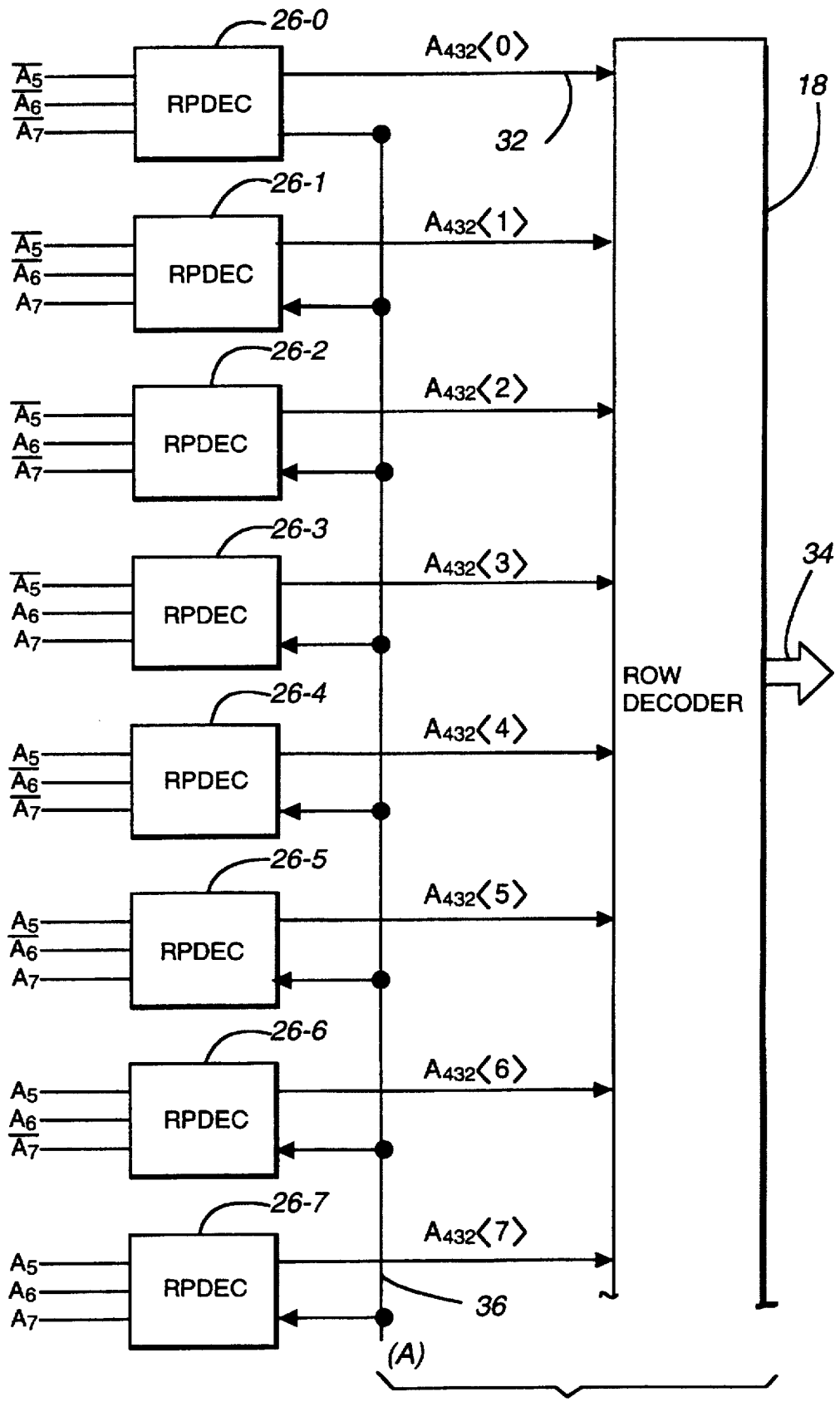
FIG. 6A–6B illustrates a block diagram, similar to that shown in FIGS. 5A–5B, but of another embodiment of the present invention.
Figure 6B:
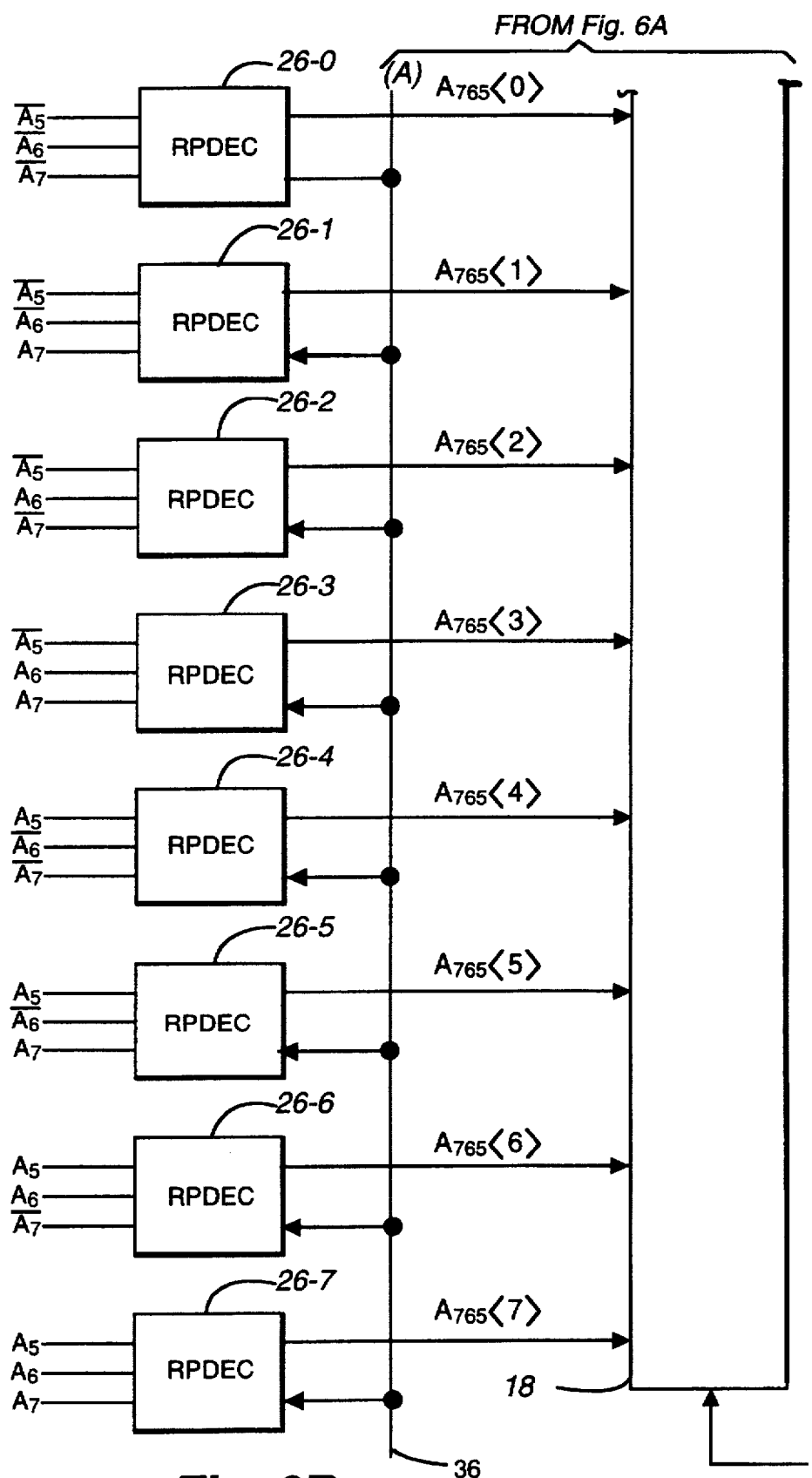

FIGS. 6A–6B illustrates a portion of the addressing circuitry of the memory device 10 of another embodiment of the invention. Two banks of row predecoders 26-0 through 26-7 are shown wherein the two separate banks of row predecoders are coupled to receive two sets of address select signals, in conventional manner. During normal operation of the memory device 10, a single row predecoder element generates a signal on one of the lines 32 for any particular value of address select signals applied to the banks of row predecoder elements. When, however, the burn-in mode signal is generated upon the line 36, additional numbers of row predecoder elements generate signals on the lines 32. As described previously with respect to FIG. 5A–5B, a two-fold increase in the number of row predecoders for each bank of row predecoders. This generates a four fold increase on the lines 32 for any particular value of the address select signals applied thereto. Signals are generated upon four lines 32 connected to each bank of row predecoders 26-0 through 26-7. During a burn-in period, additional rows of memory cells of a memory array can be addressed and stressed to permit an increased throughput of memory devices during a burn-in period. As greater numbers of rows of memory cells can be accessed during a particular time period, detection of defects in the memory cells of the memory devices can be more quickly detected.

Figure 7:
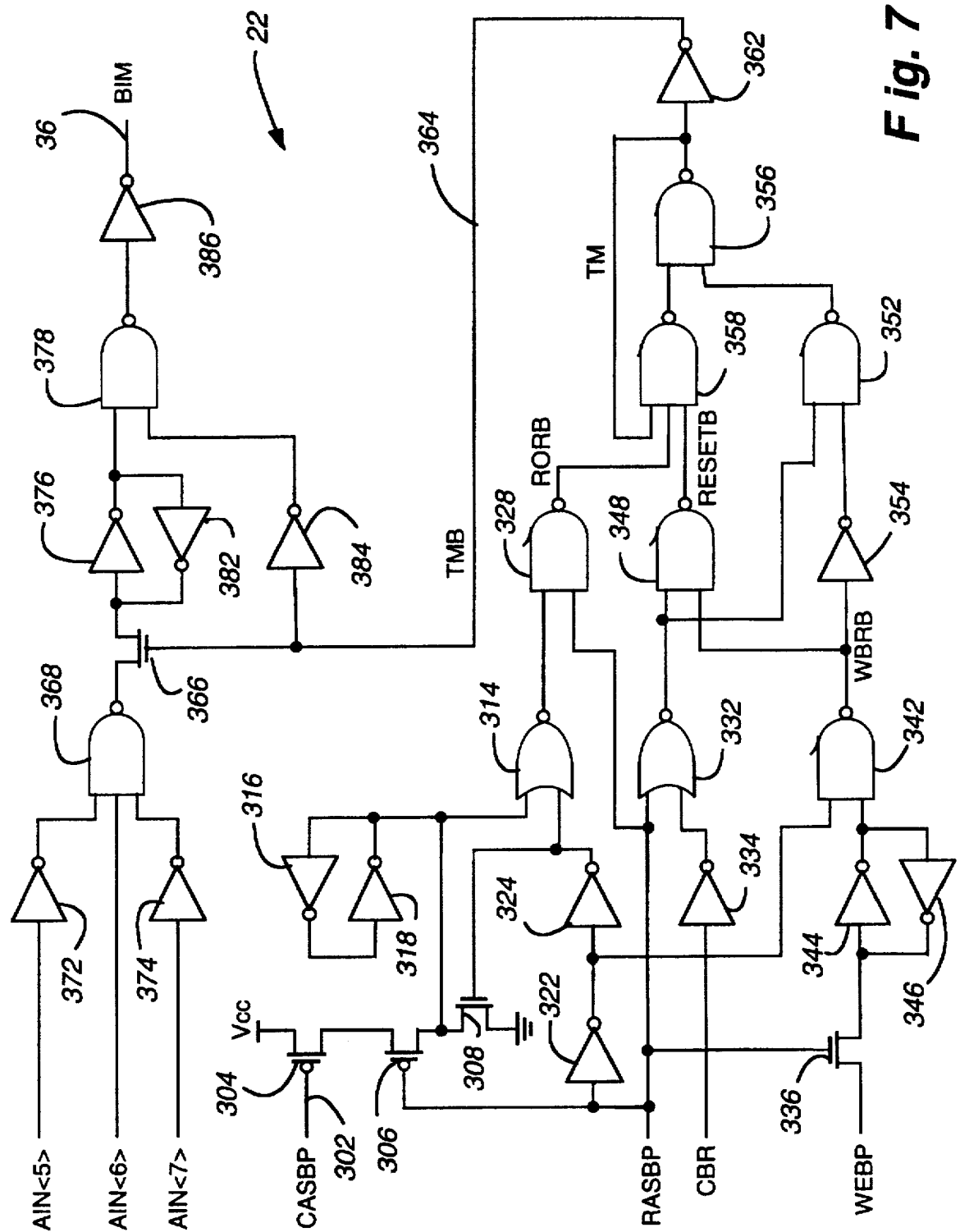
FIG. 7 illustrates a logical circuit diagram of the burn-in mode signal generator, shown in FIG. 1.

FIG. 7 illustrates the burn-in mode signal generator 22, shown previously in FIG. 1, which generates a burn-in mode signal on the line 36 when the $\overline{RAS}$, $\overline{CAS}$, $\overline{WE}$, and address select signals $A_5$, $A_6$, and $A_7$ are applied to the generator 22 in manners as illustrated previously with respect to FIGS. 2A–F. While the logical circuitry of the signal generator is illustrated in FIG. 7 to be formed of negative-boolean logic circuitry, the signal generator may, of course, be implemented in other manners.

The column address select signal is applied to the signal generator on line 302 which is coupled to a gate electrode of a first of two, cascaded transistors 304 and 306. An electrode of the transistor 304 is coupled to a supply voltage, and an electrode of the transistor 306 is coupled to a ground potential through a transistor 308. The $\overline{RAS}$ signal is applied to the signal generator to a gate electrode of the transistor 306. When the values of the $\overline{CAS}$ and $\overline{RAS}$ signals are of selected values, the transistors 304 and 306 are turned-on, and the line 312 is caused to be of the supply voltage potential. The line 312 is coupled to an input of a NOR gate 314. The line 312 is further coupled to inverters 316 and 318, connected together in a parallel connection.

The $\overline{RAS}$ signal is further coupled to an input of an inverter 322, and an output of the inverter 322 is coupled to a second inverter 324. An output of the second inverter 324 is coupled by way of line 326 to another input of the NOR gate 314. The line 326 is further coupled to a gate electrode of the transistor 308. An output of the NOR gate 314 is coupled to an input of a NAND gate 328 and the $\overline{RAS}$ signal is coupled to a second input of the NAND gate 328. The $\overline{RAS}$ signal is also applied to an input of a NOR gate 332, and a CBR signal is coupled to a second input of the NOR gate 332 by way of an inverter 334. The $\overline{RAS}$ signal is further applied to a gate electrode of a transistor 336. The $\overline{WE}$ signal is applied to a second electrode of the transistor 336, and a third electrode of the transistor 336 is coupled to an input of a NAND gate 342 by way of an inverter 344 which is connected in a parallel connection with an inverter 346. An output of the inverter 322 is coupled to another input of the NAND gate 342.

Outputs of the NOR gate 332 and NAND gate 342 are coupled to inputs of a NAND gate 348.

The output of the NOR gate 332 is further coupled to an input of a NAND gate 352, and the output of the NAND gate 342 is coupled to another input of the NAND gate 352, by way of an inverter 354. An output of the NAND gate 352 is coupled to an input of a NAND gate 356, and an output of the NAND gate 356 is coupled to an input of a NAND gate 358. Outputs of the gates NAND 328 and 348 are also coupled to inputs of the NAND gate 358.

An output of the NAND gate 356 is coupled, by way of an inverter 362 on line 364 to a gate electrode of a transistor 366. Another electrode of the transistor 366 is coupled to an output of a NAND gate 368. The $A_5$ and $A_7$ signals are applied to inputs of the NAND gate 368 by way of inverters 372 and 374, respectively. And, the signal $A_6$ is coupled to another input of the NAND gate 368. When the signal generated on the lines 364 is of a value to turn on the transistor 366, and the values of the signals $A_5$, $A_6$, and $A_7$ are of logical values of zero, one, and zero, the NAND gate 368 generates a low logical output which is provided to an inverter 376 and an inverted value generated by the inverter 376 is applied to a NAND gate 378. A second inverter 382 is coupled in a parallel connection with the inverter 376. The signal generated on the line 364 is coupled to another input of the NAND gate 378, by way of an inverter 384. The output of the NAND gate 378 is inverted by an inverter 386 on line 36.

The burn-in mode signal generator 22 is operable to generate a signal on line 36, and to cause termination of generation of such signal, when the signals are applied to the signal generator in manners described previously with respect to FIGS. 2A–2E.

In another embodiment of the present invention, the word lines extending to the rows of memory cells are prevented from being precharged. After the word lines are selected, the voltage levels of the word lines are permitted to float near the supply voltage levels. The addresses are then cycled in conventional manner of a conventional burn-in procedure. When the original address is again selected, the word line level is then reinforced to the supply voltage level and then floats again. This results in all of the word lines to be "on" at one time. Addressing and selecting increased numbers of rows of memory cells is similarly also possible.

Figure 8A:
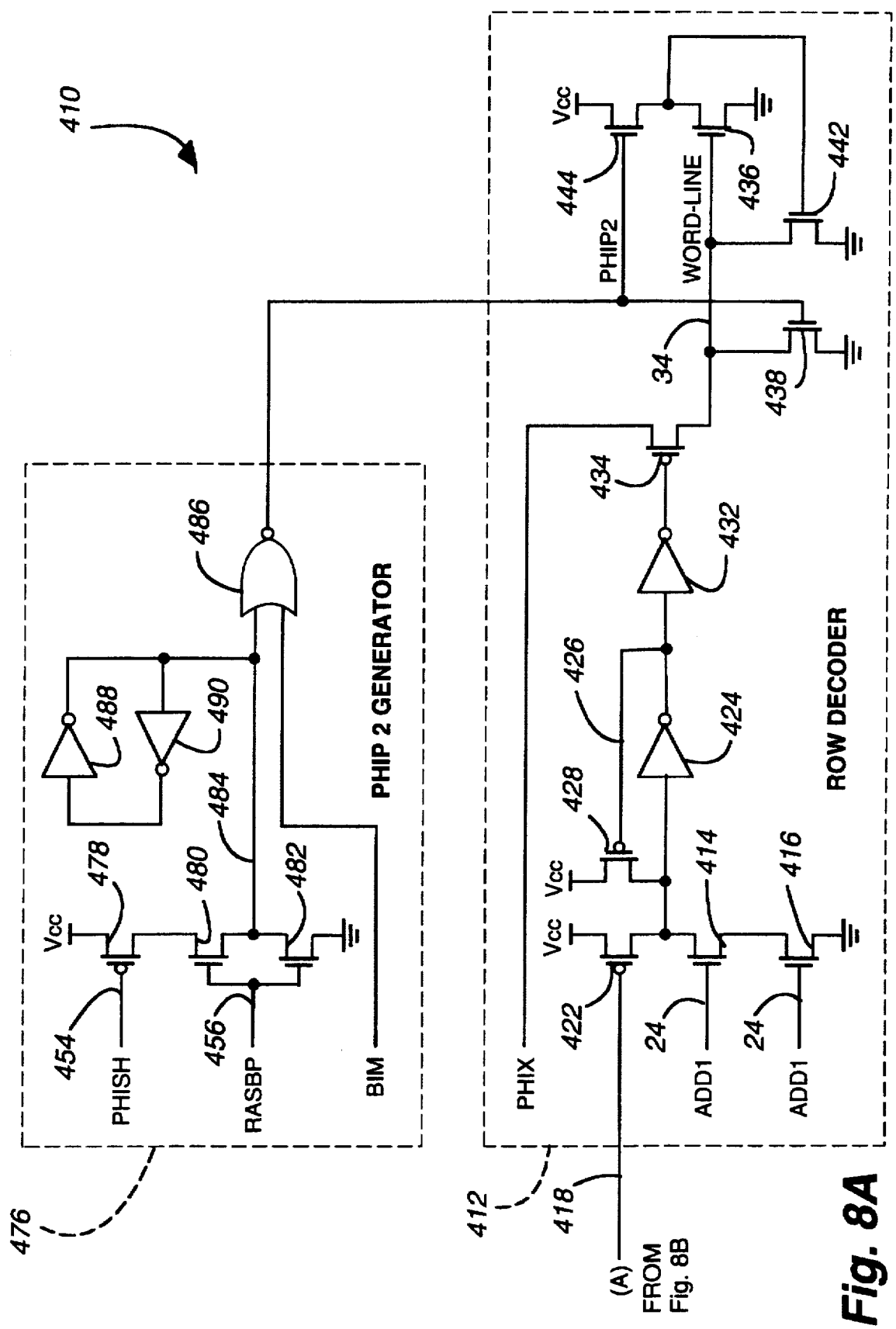
FIG. 8A–8B illustrates a circuit diagram of a portion of a memory device of an alternate embodiment of the present invention.
Figure 8B:
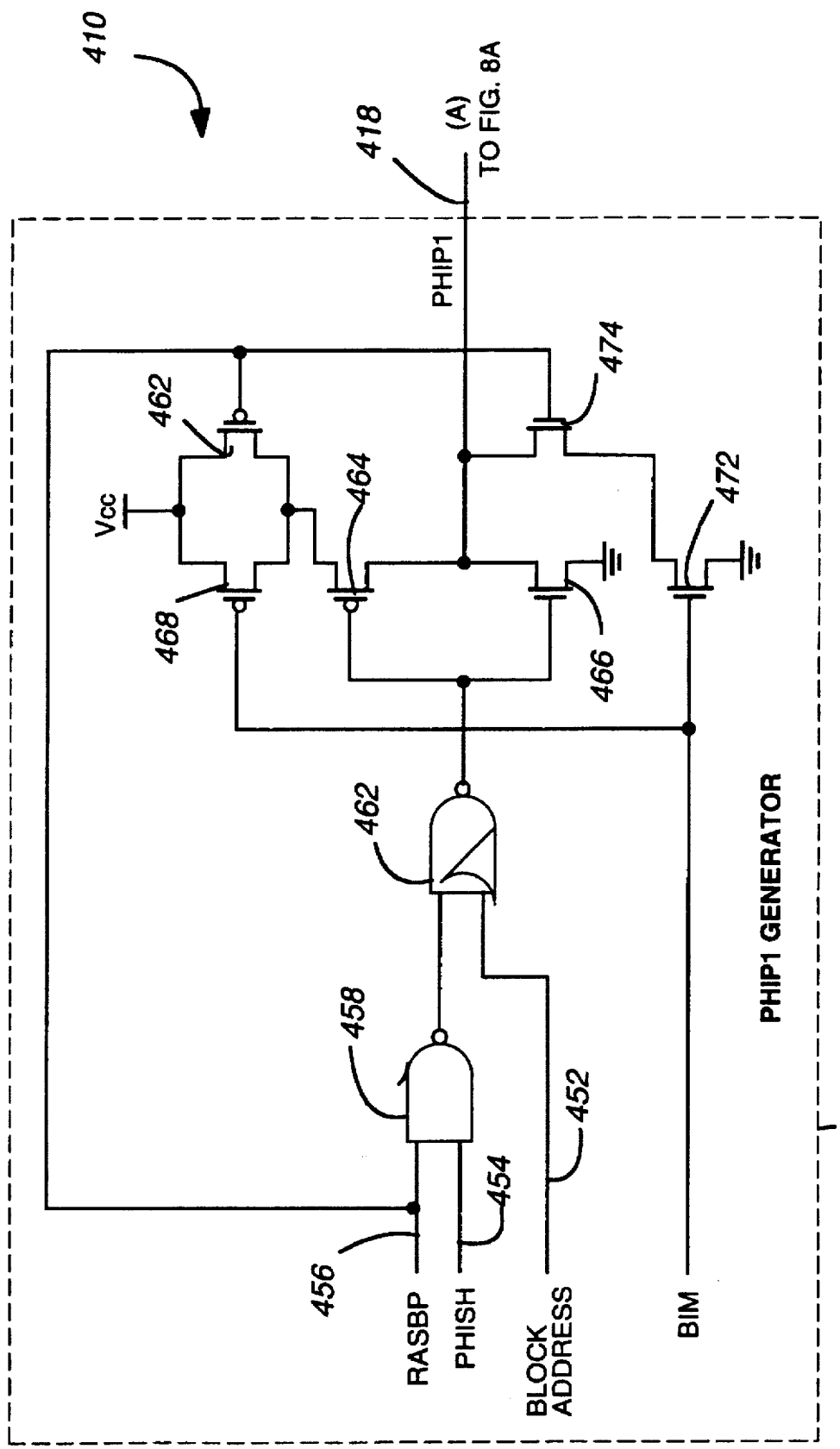

FIGS. 8A–8B illustrates a portion of this other embodiment of the present invention. A portion of a memory device, here shown generally at 410 and referred to at times as a word line drive device, includes row decoder circuitry, formed of the elements encompassed by the block 412, shown in dash. Address select signals 24, here designated by i and j are coupled to gate electrodes of transistors 414 and 416, respectively. A biasing signal, generated by circuitry described below, is applied on line 418 to a transistor 422. Transistors 422, 414 and 416 are cascaded together and a line 423 coupled to electrodes of the transistors 414 and 422 are coupled to an inverter 424. An output line 426 coupled to an output of the inverter 424 is coupled to a gate electrode of a transistor 428. The other electrodes of the transistor 428 are coupled between a supply voltage and the line 423.

The output of the inverter 424 is coupled to a second inverter 432. The output of the second inverter 432 is coupled to a gate electrode of transistor 434. Other electrodes of the transistor 434 are coupled to a biasing signal and to a word line 34. The word line 34 is used to address a row of memory cells of the memory array, such as the memory array 12 shown in FIG. 1.

The word line 34 is additionally coupled to a gate electrode of transistor 436, and electrodes of transistors 438 and 442. The transistor 436 is further coupled in a cascaded connection with transistor 444.

A first biasing signal generator, here encompassing the elements encompassed by the block 448, shown in dash, generates a signal on the line 418 which is applied to the gate electrode of the transistor 422. The first biasing signal generator is coupled to line 36 to receive the burn-in mode signal generated by the generator 22, shown previously in FIG. 1, a block address signal on line 452, a biasing signal on the line 454, and a RAS signal on the line 456. Lines 454 and 456 are coupled to inputs of a NAND gate, and an output of the gate 458 is coupled in an input of a NAND gate 462.

The line 452 is coupled to a second input of the gate 462. The line 452 is coupled to a second input of the gate 462. An output of the gate 462 is coupled to gate electrodes of transistors 464 and 466. The transistors 464 and 466 are connected in a cascaded connection together with a transistor pair 468 and 472. The line 36 is coupled to a gate electrode of the transistor 468 and also to a gate electrode of a transistor 471. The transistor 471 is further coupled between a ground connection and an electrode of a transistor 474. Gate electrodes of the transistors 474 and 472 are coupled to the line 456. Electrodes of the transistors 464, 466, and 474 are further coupled to line 418 upon which the first biasing signal is generated.

A second biasing signal generator, formed of the elements encompassed by the block 476, shown in dash, is coupled to the line 454 and also to the line 456. Line 454 is coupled to a gate electrode of a transistor 478 and the line 456 is coupled to gate electrodes of the transistors 480 and 482. The transistors 478, 480, and 482 are coupled in a cascaded connection. Line 484 extends from the cascaded connection of transistors 478, 480 and 482 to an input of a gate 486 and also to a parallel-connected inverter pair 488 and 490. The line 36, upon which the test mode signal is generated, is coupled to a second input of the gate 486. An output of the gate 486 is coupled to gate electrodes of the transistors 444 and 438 of the row decoder 412.

Figure 9A:
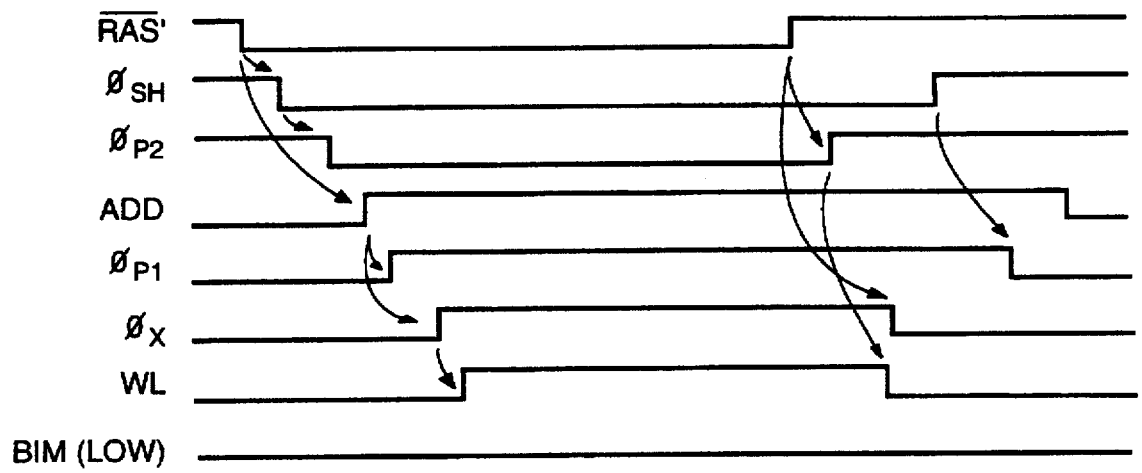
FIGS. 9A–9B illustrate timing diagrams exemplary of operation of the memory device shown in FIGS. 8A–8B.
Figure 9B:
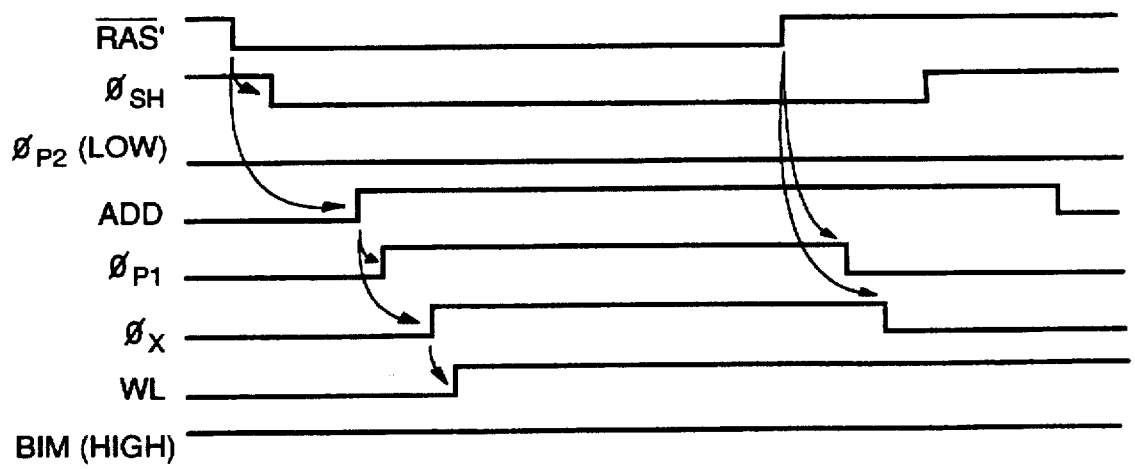

The timing diagram of FIGS. 9A and 9B illustrates operation of the circuitry of the memory device 410 shown in FIGS. 8A–8B. FIG. 9A illustrates a regular mode of operation of the memory device 410, and FIG. 9B illustrates operation of the memory device when a burn-in mode signal is generated.

The embodiment of FIGS. 8A–8B is particularly advantageous when power considerations are significant. In this embodiment, the word lines which address rows of memory cells are selected sequentially rather than concurrently; the word lines are essentially prevented from being precharged. As a result, amounts of power required to address the additional word line or lines is not increased. Therefore, the internal bus structure of an integrated circuit embodying the invention does not have to be increased in size. And, an internal power generator, typically used to power the driver similarly does not need to be increased in capacity.

Presently-preferred embodiments of the present invention have been described with a degree of particularity. The previous descriptions are of preferred examples for implementing the invention, and the scope of the invention should not necessarily be limited by this description. The scope of the present invention is defined by the following claims.

What is claimed is:

1. In a memory device having rows and columns of memory cells together forming a memory cell array and addressing circuitry operative responsive to address select signals for addressing selected rows of the memory cell array, a combination with the addressing circuitry of a row predecoder for receiving signals representative of the address select signals and a test mode signal and for generating row select signals for permitting addressing of selected rows of the memory cell array, said predecoder comprising:

decoding circuitry coupled to receive the signals representative of the address select signals, said decoding circuitry for generating the row select signals permitting the addressing of the selected rows responsive to values of the signals representative of the address select signals; and test mode circuitry coupled to receive the test mode signal and coupled to said decoding circuitry, said test mode circuitry operative responsive to reception of the test mode signal for causing the decoding circuitry to generate the row select signals for permitting concurrent addressing of at least two rows of the memory cell array.

2. The predecoder of claim 1 wherein the memory device comprises a dynamic random access memory and wherein, in the absence of reception of the test mode signal by the test mode circuitry generation of the row select signals by said decoding circuitry permits addressing of one selected row of memory cells of the array of memory cells.

3. The predecoder of claim 2 wherein the address select signals comprise parallel binary signals and wherein said decoding circuitry generates the row select signal when the parallel binary signals are of a first logical combination of signal values.

4. The predecoder of claim 3 wherein said test mode circuitry, upon reception of the test mode signal, causes said decoding circuitry to generate the row address select signal when the parallel binary signals are of the first logical combination of signal values and a second logical combination of signal values.

5. The predecoder of claim 4 wherein the first logical combination and the second logical combination of signal values, respectively, differ from one another by a value of one binary signal of the parallel binary signals.

6. The predecoder of claim 3 where said test mode circuitry, upon reception of the test mode signal, causes said decoding circuitry to generate the row address signals when the parallel binary signals are of the first logical combination of signal values, a second logical combination of signal values, a third logical combination of signal values, and a fourth logical combination of signal values.

7. The predecoder of claim 3 wherein said decoding circuitry comprises a plurality of decoders, each decoder of said plurality of decoders coupled to receive said address select signals and each decoder for generating at least one row select signal.

8. The predecoder of claim 7 wherein the decoders of said plurality of decoders correspond in number with a number of logical combinations of signal values permitted of the parallel binary signals forming the address select signals.

9. The predecoder of claim 3 wherein the parallel binary signals forming the address select signals comprise at least a three-bit signal generated on at least a first line, a second line, and a third line, and wherein said decoding circuitry includes at least a first input pad, a second input pad, and a third input pad coupled to receive said first line, said second line, and said third line, respectively, upon which the address select signals are generated.

10. The predecoder of claim 9 wherein said decoding circuitry forms a shunt circuit to shunt the third input pad to a selected signal value when the test mode select signal is received thereat.

11. The predecoder of claim 1 further comprising a test mode generator for generating the test mode signal.

12. The predecoder of claim 11 wherein said test mode generator generates the test mode signal to stress groups of rows of memory cells of the memory device.

13. The predecoder of claim 1 wherein the memory device comprises a dynamic random access memory and wherein the test mode signal is generated responsive to times in which a row address select signal, a column address select signal, and a write enable signal is generated in a selected sequence and selected ones of the address select signals are of selected signal values.

14. A method for generating a row select signal to select addressing of selected rows of memory cells of a memory cell array of a memory device, said method comprising the steps of:

applying address select signals to the memory device;

when testing the memory cell array, further applying a test mode select signal to the memory device;

generating a first row select signal on a first selected word line, the first row select signal for selecting addressing of a first selected row of memory cells when the address select signals applied to the memory device during said first step of applying are of a first selected value;

further generating at least a second row select signal on at least a second selected word line, the second selected row select signal for selecting concurrent addressing of at least a second selected row of memory cells when the address select signals are of at least a second selected value and the test mode select signal is applied to the memory device during said step of further applying.

15. The method of claim 14 wherein the address select signals applied to the decoding circuitry during said step of applying comprise at least three-bit binary signals applied to the memory device on at least a first line, a second line, and a third line and wherein said step of generating comprises generating the first row select signal when the binary signals applied on the first line, the second line, and the third line are each of first selected values.

16. The method of claim 15 wherein said step of further generating comprises generating at least the second row select signal when the binary signals applied on the first line and the second line are each of the first selected value.

17. The method of claim 15 wherein the memory device comprises decoding circuitry and wherein the address select signals generated during said first step of applying are applied to the decoding circuitry.

18. The method of claim 14 wherein said step of generating comprises biasing the first selected word line and, thereafter, said step of further generating comprises biasing the second selected word line.

19. A circuit for increasing rates at which memory cells of a memory device are stressed during testing thereof, the memory cells positioned in rows and columns to form an array of memory cells and the memory device coupled to receive address select signals, said circuit comprising:

a test mode signal generator for generating a test mode signal; and a memory cell array decoding device coupled to receive the test mode signal generated by said test mode signal generator and the address select signals, said memory cell array decoding device for generating row select signals of values determinative of which of the rows of memory cells of the array are to be stressed, the row select signals of values causing selection of an increased number of rows of the memory cells of the array to be concurrently stressed when the test mode signal is generated.

20. The circuit of claim 19 further comprising a word line drive device, said word line drive device for altering values of the row select signals.

21. A circuit for increasing rates at which memory cells of a memory device are stressed during testing thereof, the memory cells positioned in rows and columns to form an array of memory cells, the rows of the memory cells addressed byway of word select lines, and the memory device coupled to receive address select signals, said circuit comprising:

a test mode signal generator for generating a test mode signal;

a word line drive device coupled to receive the test mode signal generated by said test mode signal generator, said word line drive device for causing generation of a row select signal on at least one additional word select line, thereby to concurrently address at least one additional row of memory cells when the test mode signal is generated;

a memory cell array decoding device coupled to receive the address select signals, said memory cell array decoding device for generating a row select signal on a selected word select line to address a selected row of memory cells.

22. A circuit for generating a row select signal to select addressing of selected rows of memory cells of a memory cell array of a memory device, said circuit comprising:

means for applying address select signals to the memory device;

means for applying a test mode select signal to the memory device when testing the memory cell;

means for generating a first row select signal on a first selected word line, the first row select signal for selecting addressing of a first selected row of memory cells when the address select signals applied to the memory device by said means for applying are of a first selected value;

means for further generating at least a second row select signal on at least a second selected word line, the second selected row select signal for concurrently selecting addressing of at least a second selected row of memory cells when the address select signals are of at least a second selected value and the test mode select signal is applied to the memory device by said means for applying.

* * * * *